(12) United States Patent
Lukanc et al.

(10) Patent No.: US 6,641,747 B1
(45) Date of Patent: Nov. 4, 2003

(54) METHOD AND APPARATUS FOR DETERMINING AN ETCH ENDPOINT

(75) Inventors: Todd P. Lukanc, San Jose, CA (US); Ercan Adem, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 267 days.

(21) Appl. No.: 09/783,204

(22) Filed: Feb. 15, 2001

(51) Int. Cl.[7] .................. C23C 16/00; C23C 14/32; G01R 31/00
(52) U.S. Cl. .............. 216/61; 216/59; 216/60; 156/345.24; 156/345.25; 204/192.33; 204/298.32
(58) Field of Search ............... 216/59, 60, 61; 156/345.24, 345.25; 204/192.33, 298.32

(56) References Cited

U.S. PATENT DOCUMENTS

| 4,282,268 A | | 8/1981 | Priestley et al. | |
|---|---|---|---|---|
| 4,609,809 A | * | 9/1986 | Yamaguchi et al. | ... 204/192.34 |
| 5,450,205 A | | 9/1995 | Sawin et al. | |
| 6,030,509 A | | 2/2000 | Fu-Kang et al. | |
| 6,077,782 A | | 6/2000 | Hsu et al. | |
| 6,107,192 A | | 8/2000 | Subrahmanyan et al. | |
| 6,114,250 A | | 9/2000 | Ellingboe et al. | |
| 6,210,981 B1 | * | 4/2001 | Birdsley et al. | ................. 438/9 |
| 6,287,977 B1 | * | 9/2001 | Hashim et al. | ............. 438/722 |

* cited by examiner

Primary Examiner—Rodney G. McDonald

(57) ABSTRACT

An apparatus and method for detecting an endpoint for an etching process utilize a reaction chamber with an ion source and detector placed within the reaction chamber. The ion source directs a primary beam of ions towards a wafer so that the ion beam impacts the top layer of the wafer. A detector detects primary ions reflected from the wafer and secondary ions scattered from the wafer. A value is determined that corresponds to the amount of reflected and scattered ions. A change in the value indicates that the ion beam is impacting a layer beneath the top layer of the wafer, and signifies the reaching of the etch process endpoint.

20 Claims, 5 Drawing Sheets

METHOD AND APPARATUS FOR DETERMINING AN ETCH ENDPOINT

FIELD OF THE INVENTION

The present invention relates to detecting the end of an etching process, and particularly to detecting the end of a plasma etching process.

DESCRIPTION OF RELATED ART

Monitoring an etch process to determine the etch endpoint is a critical aspect of manufacturing semiconductor devices. Determining when an etch process has completely etched through one layer provides essential information regarding when to stop the etching process. Without an accurate determination of when a layer is completely etched through, an etch process may be terminated early, or proceed for too long, resulting in under-etching or over-etching of a semiconductor device.

Under-etching degrades a semiconductor device by leaving residues of the material etched through. For example, under-etching an insulator from a metal layer leaves insulator residue on the exposed metal, potentially causing poor vertical conduction between metal layers. Such unetched residue reduces the manufacturing yield of usable semiconductor devices from a wafer and increases the costs of manufacturing semiconductor devices.

Over-etching degrades a semiconductor device by attacking sidewalls and/or causing pattern degradation. In the case of etching a metal layer, over-etching may reduce conductor line width when the metal layer sidewalls are etched from underneath the mask, and/or could reduce the metal film thickness. Such reduced metal line width or reduced film thickness increases resistance and current density in the metal line during use of the semiconductor device and contributes to circuit failure. In the event contacts, e.g. vias, are over-etched, over-etching could increase the surface roughness of the contacts, or create undesirable undercut, or change the profile of the contact, which could adversely impact the deposition properties of the conductor.

Many methods have been developed and are utilized for detecting etch endpoints during semiconductor device manufacture. Commonly used methods determine an etch endpoint by monitoring a particular property of either the etching process parameters, or of the materials comprising the etch layer and layer underlying the etch layer. Because there are a variety of etching processes using different plasmas and other etch chemistries that etch through many different materials, a single etch endpoint determining method does not completely and accurately determine the end of all etching processes.

One technique for determining the end of a plasma etch is to time the etching process, and compare the elapsed time to a predetermined etch rate. A predetermined etch rate is experimentally determined in a calibration step, however, the exact conditions i.e., pressure, gas flow, electric field, etc., existing during the calibration step cannot be precisely duplicated when the etch is performed, rendering endpoint determination based upon elapsed time inaccurate.

More precise methods of determining the end of a plasma etch process analyze the by-products of the etching process, i.e., the plasma in the reaction chamber or the gas phase species within the plasma produced by reacting the plasma with the material being etched. Such techniques rely upon the fact that the initial plasma is a known composition, and that it is known what elements and compounds are in the material to be etched. Typically, a detector capable of detecting an element or compound released from the top layer, i.e., the layer to be etched, and/or the underlying layer is used to monitor the presence of such elemental species in the plasma, and sends a signal to diagnostic electronics. When the signal representing the presence of the monitored element in the plasma changes, the diagnostic electronics indicate that the etching process is complete.

One such technique, optical emission spectroscopy, monitors the intensity of optical emission in the plasma. The intensity of the optical emission is related to the concentration of elements and compounds in the plasma. The completion of the etch process is determined when a change in the intensity of the optical emission is observed, such as when the concentration of elements and/or compounds in the plasma changes as a result of etching through the top layer and into the underlying substrate.

Other by-product diagnostic techniques have been utilized to identify the endpoint of an etch process. These include laser interferometry, ellipsometry, acoustic monitoring (passing the gas stream from a reaction chamber of a plasma reactor through an acoustic cell at constant temperature to monitor the velocity of an acoustic signal which changes as the average molecular weight of the gas changes), monitoring a wafer using a charge coupled device camera which transduces reflected light into electromagnetic signals, and mass spectrometry.

A significant limitation to using by-product diagnostic techniques is an inherent lag time. Etching through the top layer is completed before there are detectable changes to the plasma that signify an etch endpoint. The amount of time that elapses between complete etching and detection of a change in the plasma increases the potential for damaging over-etching compared to a more rapid and real-time determination of the etch endpoint.

Another significant limitation to using by-product diagnostic techniques is that often a minute amount of material is etched, i.e., less than 1% of a wafer, thus only a minor change to the plasma and/or by-products occurs which can be very difficult to detect, sometimes resulting in failure to identify the end of the etching process. Etch endpoint determination is also difficult when a large amount of material is etched, i.e., a sputter etch to remove an oxide layer from a metal layer prior to deposition. Often, the volume of the chamber in which the etch is performed is too large to mount current etch endpoint determining equipment, and too large to adequately monitor etch by-products, leaving timing as the only manner for determining the etch endpoint.

Sputter etching typically occurs in a large volume chamber, which is in turn part of an even larger chamber. Because the volume of the chamber in which sputter etching occurs is large, current etch endpoint detection equipment cannot be mounted within the chamber in order to detect a change in the by-products of the etching process. Additionally, if spectroscopy instruments were mounted inside a sputter etch chamber, for example, part of a metal deposition system, the volume of system is too large for the equipment to accurately determine the composition of the etch by-products. Such difficulties resulting from the large volume in which sputter etching typically occurs currently makes. timing a large volume sputter etch process the only method for determining the etch endpoint. As previously noted, timing an etch process in order to determine an endpoint does not result in an accurate etch endpoint determination.

As manufacturing techniques adopt smaller device geometries, precise etching is becoming more critical to producing a high yield of working semiconductor devices from each wafer. The prior by-product techniques are suitable for detecting an etch endpoint in many circumstances, but do not adequately determine etch endpoints in many other circumstances as previously described.

Accordingly, there is a need for improved techniques for determining etch endpoints that are currently undetectable and/or detected well after the etch process is complete. There is a particular need to monitor currently unmonitored properties of an etch process in order to increase the number of different etch processes in which accurate endpoint determinations can be made.

SUMMARY OF THE INVENTION

There is a need for increasing the number of situations in which an etch endpoint can be determined. There is also a need for more accurately determining when an etch endpoint is reached.

These needs and others are met by embodiments of the present invention, which provide a method and apparatus for identifying an etch endpoint based upon reflected and secondary ions. An ion source is used to direct a beam of ions towards a wafer, and a detector is used to detect the reflected and secondary ions that scatter from the wafer as a result of the ion beam impacting the wafer. A change in the detected value of the reflected and scattered ions indicates an etching process endpoint has been reached. Embodiments of the present invention utilize a voltage contrast scanning electron microscope as a source of ions and as a detector of reflected and secondary ions.

Accordingly, one aspect of the invention relates to an apparatus for detecting an endpoint for an etch process. The apparatus comprises an ion source and an ion detector that emit ions and detect ions, respectively, in a reaction chamber. A signal processor is coupled to the detector. The ion source directs a beam of ions toward a wafer in the reaction chamber. The detector detects reflected primary ions and secondary ions that are scattered from the wafer as a result of the ion beam striking the wafer. Based upon the detected ions, the ion detector generates a signal. The signal processor determines a value based upon the signal from the detector.

In certain embodiments, a plasma source creates a plasma at a first frequency in the reaction chamber. A positive electrode in the reaction chamber contains the plasma on one side. The ion source and the ion detector are both shielded from the plasma by the positive electrode. A first aperture in the positive electrode allows the ion source to direct its beam of ions toward the wafer. A second aperture in the positive electrode allows the detector to detect the reflected and back scattered ions. The ions emitted by the ion source are at a second frequency that is different than the frequency of the ions in the plasma. A filter is coupled to the detector and to the signal processor, and removes the signal portions generated by detected ions at the first frequency, and transmits the filtered signal to the signal processor.

Another aspect of the present invention relates to a method for detecting an endpoint of an etch process. The method comprises the steps of emitting ions from a source towards a wafer; and detecting the reflected and secondary scattered ions released from the wafer as a result of the emitted ions from the ion source impacting the wafer. The method also comprises the steps of creating a signal based upon the detected reflected primary ions and scattered secondary ions; and determining a value for the detected ions based upon the signal. The method comprises the steps of etching the wafer; monitoring the value while the wafer is etched; and indicating the etch endpoint when the value changes to a second value.

In certain embodiments, the etch process is a plasma etch utilizing a plasma at a first frequency. Ions emitted from the ion source are at a second frequency; and determining the value of the detected ions further comprises filtering the signal to remove signal portions generated by detected ions at the first frequency.

Another aspect of the present invention relates to a metal deposition system comprising a vacuum chamber and an etch station within the vacuum chamber. The metal deposition system comprises a plasma source at the etch station, an ion source at the etch station, a detector at the etch station, and a signal processor communicating with the detector. The detector detects reflected primary ions and secondary ions scattered off of an oxide layer as a result of ions emitted from the ion source impacting the oxide layer. The detector also generates a signal based upon the detected reflected and scattered secondary ions. The signal processor determines a value based upon the signal from the detector.

Using an ion source to direct a beam of ions towards a wafer, and using a detector to detect the reflected and secondary ions that are scattered off the wafer as a result of the ion beam impacting the wafer, greatly enhances etch endpoint detection. By detecting a change in the value of the reflected and secondary scattered ions, a method for accurately and timely determining an etch endpoint is provided that does not rely on detection of etch by-products.

Additional advantages and novel features of the invention will be set forth in part by the description which follows, and in part will become apparent to those skilled in the art upon examination of the following or may be learned by practice of the invention. The advantages of the invention may be realized and attained by the instrumentalities and combinations, particularly pointed out in the appended claims.

BRIEF DESCRIPTION OF THE DRAWINGS

The present invention is illustrated by way of example, and not by way of limitation in the figures of the accompanying drawings in which like reference numerals refer to similar elements and in which.

DETAILED DESCRIPTION OF THE INVENTION

The present invention addresses and solves problems related to etch endpoint determination, particularly where current methods do not accurately determine the endpoint of an etching process. The present invention also addresses and solves problems related to determining when an oxide layer has been etched from the surface of a metal layer in a large volume chamber. This is achieved by providing a method and apparatus that determines an etch endpoint based upon detecting reflected primary ions and secondary ions scattered from a wafer. The quantity of such reflected and scattered ions is directly related to the material that an ion beam impacts. A change in the quantity of reflected and secondary ions indicates that an ion beam is impacting a different material.

The present invention makes etch endpoint determinations possible for etching processes where etch endpoints are difficult or impossible to detect. Used alone, or when combined with current methods of etch endpoint detection, the present invention expands the number of situations where accurate detection of an etch endpoint is possible.

Figure 1:
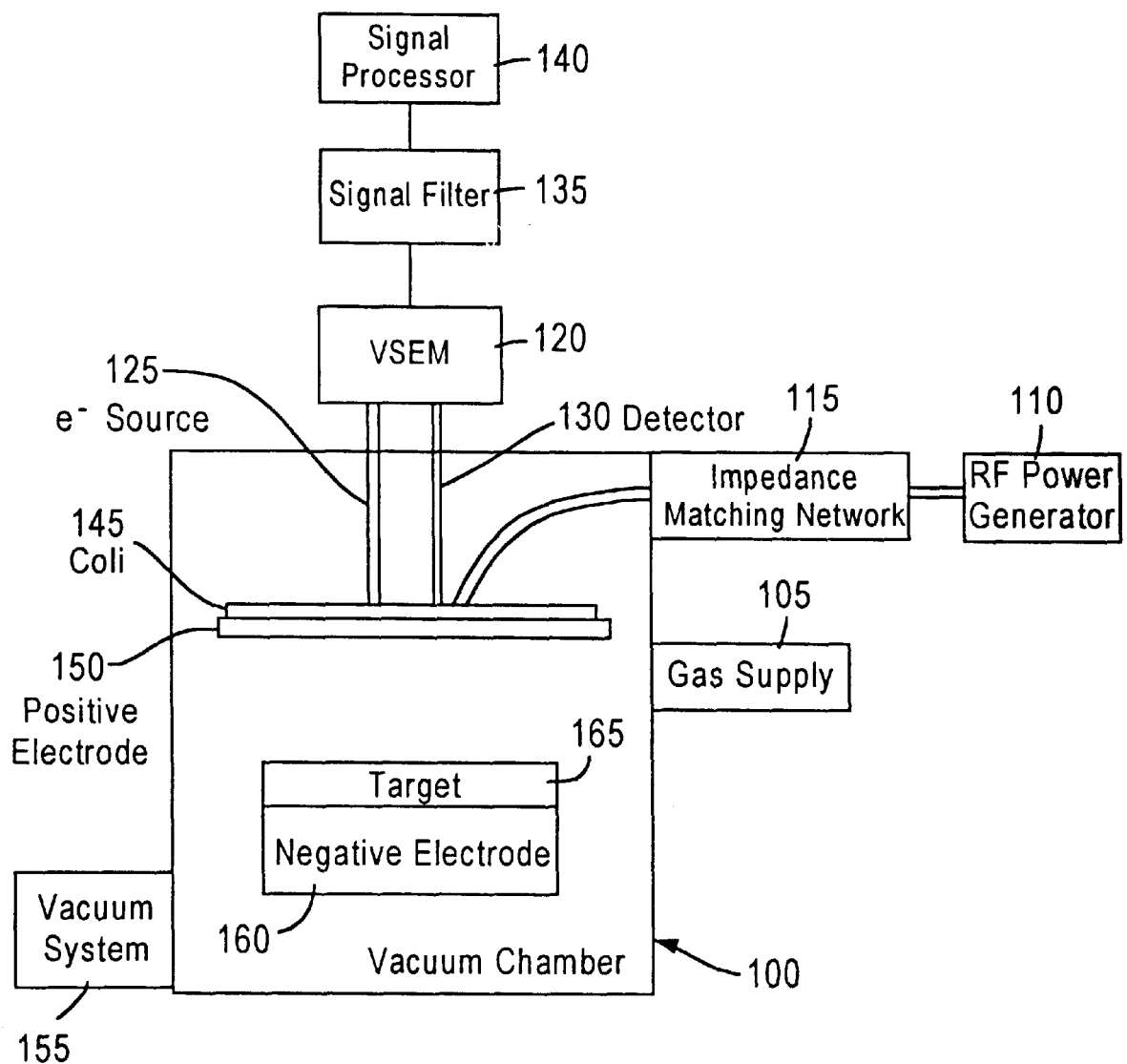
FIG. 1 is a schematic diagram of an embodiment of the present invention.

Referring now to the drawings, and initially to FIG. 1, an apparatus for detecting an etch endpoint based upon reflected and secondary ions is described. A vacuum chamber 100 communicates with a gas supply 105 and a power supply 110. An impedance matching network 115 regulates the frequency at which a plasma is created using the reactive gas from the gas supply source 105. A coil 145 is connected to a positive electrode 150 within the vacuum chamber 100. The coil 145 is also connected to the impedance matching network 115, and to power source 110. A negative electrode 160 is contained within the vacuum chamber 100 and comprises a mechanical, electrostatic, or other mechanism for holding the wafer 165 onto the electrode 160 as is well known in the art.

A plasma is created between the positive electrode 150 and the negative electrode 160 by injecting gas from the gas supply source 105 between the positive and negative electrodes 150, 160 and supplying electric current from the impedance matching network 115 and the power generator 110 to the coil 145. The impedance matching network 115 is used to regulate the frequency at which the plasma is generated. Either before or after the plasma is generated, a source of ions 125 directs an ion beam towards the wafer 165. In the embodiment of FIG. 1, the ion source 125 is a voltage scanning electron microscope head connected to a scanning electron microscope 120, or other apparatus for generating an ion beam. In certain embodiments, the ion beam is continuously directed towards the wafer 165 throughout the etching process. A detector 130, which may or may not be connected to the ion source 125 depending upon the configuration of the equipment, detects reflected ions and secondary ions that are scattered from the wafer 165 as a result of the ion beam impacting the wafer 165. A vacuum system 155 maintains the pressure within the vacuum chamber 100, as is well known in the art.

The ion source 125 and the detector 130 may be placed anywhere in the reaction chamber 100 where the ion source 125 is capable of directing an ion beam onto wafer 165 and the detector 130 is capable of detecting reflected and scattered ions. Preferably, the ion source 125 and the detector 130 are located behind a shield that protects the ion source 125 and the detector 130 from the plasma. The shield has an aperture for the ion source 125 and an aperture for the detector 130 to emit ions through and receive ions through, respectively. In certain embodiments, ion transparent covers, glass for example, cover the apertures in the shield. In certain other embodiments, the positive electrode 150 acts as the shield.

In certain embodiments, the ion beam generated by ion source 125 is generated at a different frequency (the "second frequency") than the plasma frequency (the "first frequency"). Thus, the detector 130 detects ions within the plasma at a first frequency generated by the impedance matching network 115, and detects reflected primary ions and secondary ions scattered from the wafer 165 at the second frequency. The detector 130 creates an electric signal that corresponds to the quantity of reflected and scattered ions at the second frequency, as well as the quantity of ions at the first frequency. The electric signal generated by the detector 130 is provided to a signal filter 135, where the signal portion representing the ions in the plasma field at the first frequency is filtered out of the signal. The filtered signal is provided to a signal processor 140, where a value is established that corresponds to the quantity of reflected and scattered ions from the wafer 165. During the etching process, the signal processor 140 monitors the value, which corresponds to the quantity of reflected primary ions and scattered secondary ions at the second frequency, and indicates that the etching process is complete when the value changes in a specified manner. For example, if the wafer 165 comprises an insulating layer, which reflects electrons, covering a metal layer, which absorbs electrons, then a value determined by the signal processor 140 drops when the etching process is complete, i.e., the ion beam impacts the metal instead of the insulator. Conversely, if the wafer 165 comprises a metal layer covering an insulating layer, then a value determined by the signal processor 140 increases when the etching process is complete, i.e., the ion beam impacts the insulating layer instead of the metal.

Figure 2:
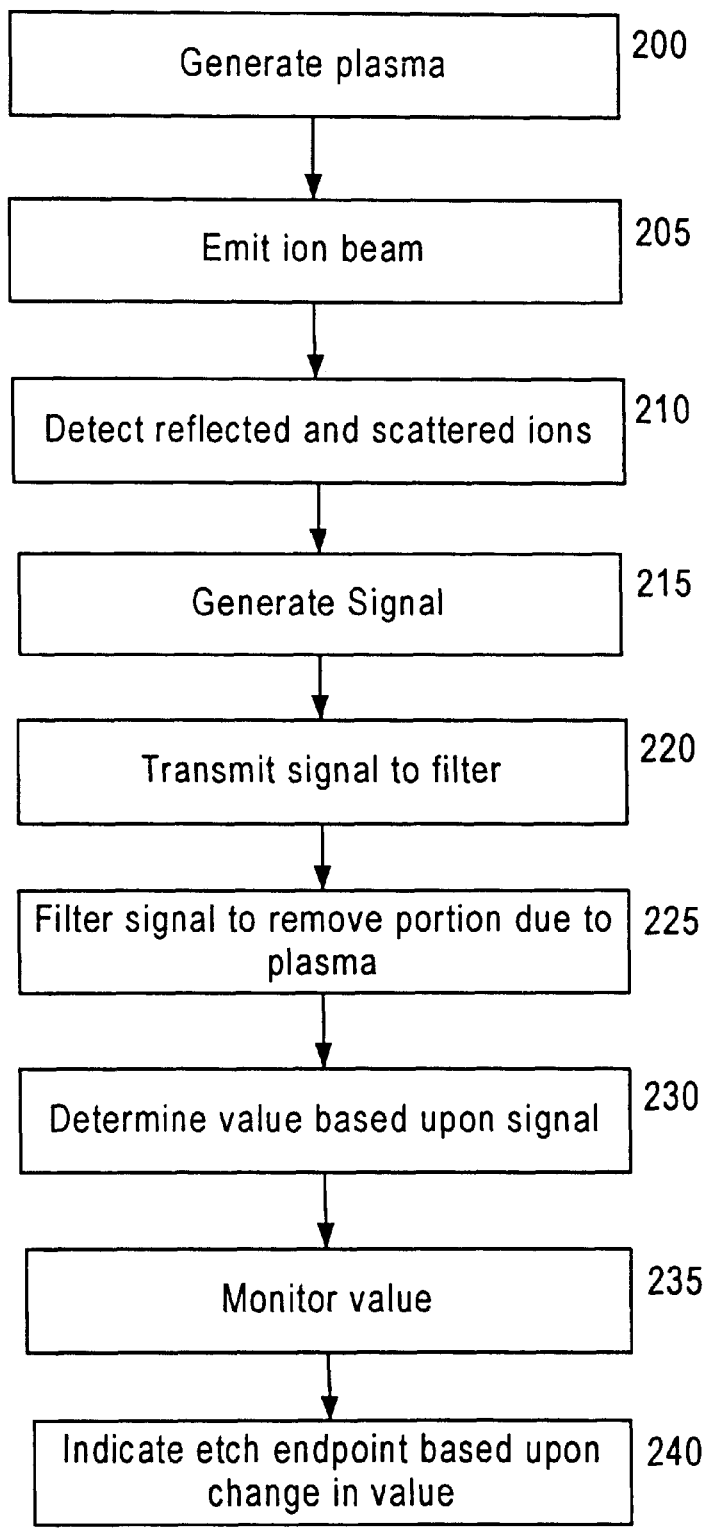
FIG. 2 is a process flow of a method according to an embodiment of the present invention.

Referring now to FIG. 2, a method for determining an endpoint of an etch process is described. At the beginning of an etching process a plasma is generated at a first frequency at step 200, and an ion beam is emitted from a source towards a wafer at step 205. The order of generating the plasma and creating the ion beam is not important, as the ion beam initially impacts the top layer of the wafer either way. The ion beam is generated to impart a second frequency to the primary ions in the beam which is different from the first frequency of the ions comprising the plasma. Reflected primary ions and secondary ions that scatter from the wafer as a result of the ion beam impacting the wafer are detected at step 210. Ions comprising the plasma are also detected at step 210. A signal based upon the detected ions at the first frequency and at the secondary frequency is created at step 215, by a detector that is part of the ion source, for example.

The signal generated at step 215 comprises two portions, one portion corresponding to detected ions at the second frequency, and one portion corresponding to detected ions at the first frequency. At step 220, the signal is transmitted to a filter. The filter filters the signal at step 225 to remove the signal portion corresponding to ions at the first frequency, in a manner well known in the art. This signal filtration step results in a signal that contains information about the quantity of reflected and scattered ions resulting from the ion beam impacting the wafer. At step 230, a value for the reflected and scattered ions at the second frequency is determined based upon the filtered signal. For example, the filtered signal is passed to a signal processor that processes the signal information to determine a value for the reflected and scattered ions at the second frequency, as is well known in the art. At step 235, the value of reflected and scattered ions resulting from the ion beam impacting the wafer is monitored while the wafer is etched. Because the different material layers in the wafer reflect and scatter different amounts of ions, a change in the value of detected reflected and scattered ions at the second frequency indicates that the etching process has etched through the top layer of the wafer and that the ion beam is now impacting the layer underneath the top layer of the wafer. At step 240, the etch endpoint is indicated when the monitored value changes to a second value.

Figure 3:
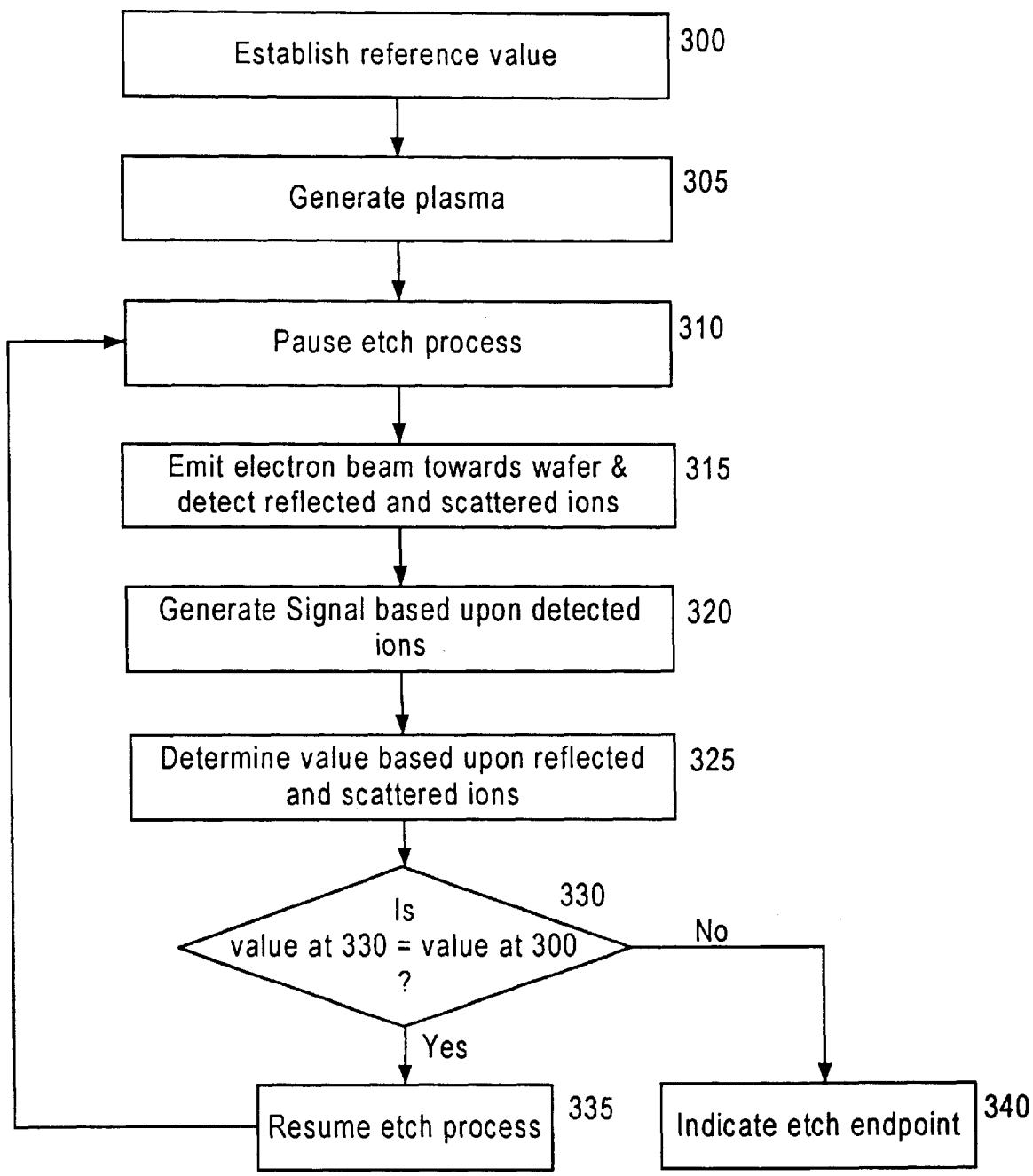
FIG. 3 is a process flow of a second method according to an embodiment of the present invention.

Referring now to FIG. 3, another method for determining an endpoint of an etch process is described. At the beginning of an etching process an ion beam is emitted from a source towards a wafer at step 300, and reflected and scattered ions are detected to establish a reference value for the top layer of material on the wafer. A plasma is generated at step 305, and the wafer is etched. At step 310, etching is paused and the reaction chamber is cleared of the plasma. At step 315, an ion beam is again emitted from the source towards the wafer, and reflected and scattered ions are detected. A signal based upon the detected ions is created at step 320, by a detector that is part of the ion source, for example.

The signal generated at step 320 contains information about the top layer of the wafer. At step 325, a value for the reflected and scattered ions is determined based upon the signal. For example, the signal is transmitted to a computer that processes the signal to determine a value for the reflected and scattered ions, as is well known in the art. At step 330, the value determined at step 325 is compared to the value determined at step 300. Because the different material layers of the wafer reflect and scatter different amounts of ions, a change in the value of detected reflected and scattered ions indicates that the etching process has etched through the top layer of the wafer and that the ion beam is now impacting the layer underneath the top layer of the wafer. At step 335, the etch process is resumed if the value determined at step 330 substantially equals the value determined at step 300. If the value determined at step 330 does not substantially equal the value determined at step 300, the etch endpoint is indicated at step 340.

Figure 4:
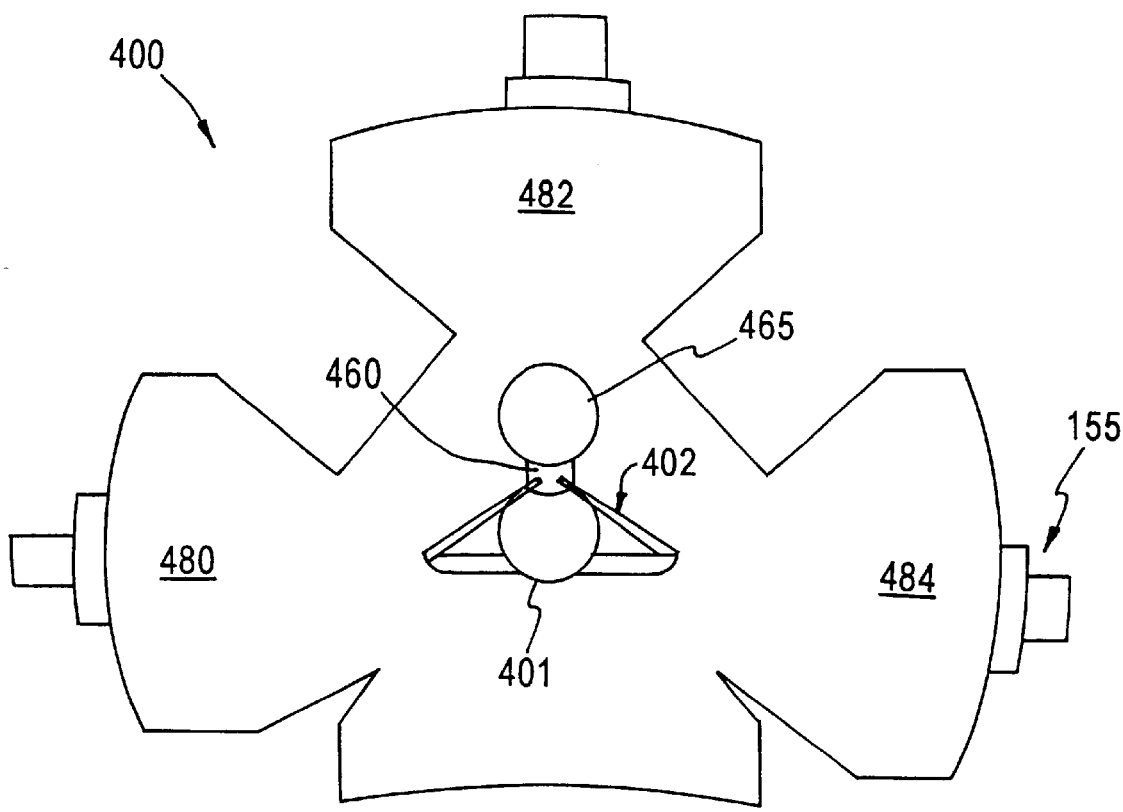
FIG. 4 is a schematic diagram of a second embodiment of the present invention.
Figure 5:
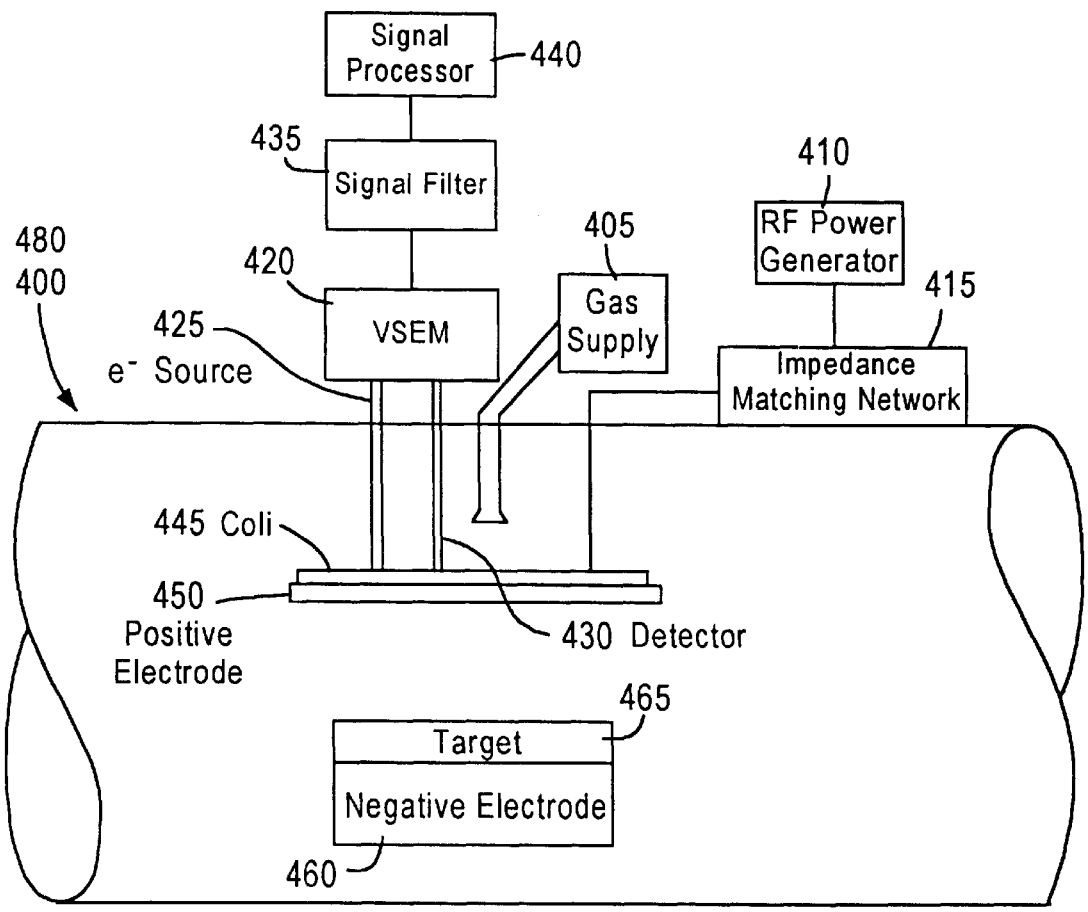
FIG. 5 is a schematic diagram of an etching station in the embodiment of FIG. 4.

Referring now to FIGS. 4 and 5, an apparatus for detecting the endpoint of a sputter etch in a large volume chamber that removes an oxide layer from a metal layer prior to metal deposition is described. Before the present invention, timing such a sputter etch was the only available method for determining the etch endpoint. Schematically depicted in FIG. 4 is a metal deposition apparatus 400 comprising separate stations in which the wafer 465 is either etched, has metal deposited onto it, etc. Since the wafer 465 is moved from one station to another, within metal deposition apparatus 400, the entire apparatus comprises a vacuum chamber which allows the wafer 465 to be maintained in a substantially oxygen free atmosphere and under pressures regulated by vacuum systems 155. Before wafer 465 is inserted into metal deposition apparatus 400, the topmost layer of the wafer, which is metal, has been exposed to oxygen and is therefore oxidized. Prior to deposition of metal onto the top layer of the wafer 465, the wafer 465 undergoes a sputter etch in order to remove the oxide layer. For example, once wafer 465 has been placed into metal deposition apparatus 400 and the atmosphere within the apparatus 400 is oxygen depleted, for example by injecting an inert gas, and under pressure as is well known in the art, pivoting mount 401 positions the wafer 465 into a station. When arms 402 extend, wafer 465 is placed into a station, for example, 480, where a sputter etch is performed on the wafer to remove the oxide layer.

Referring to FIG. 5, the wafer 465 is extended into station 480 by arms 402. Wafer 465 is secured to negative electrode 460 mechanically, by electrostatic chuck, or other method. A positive electrode 450 and a coil 445 are in station 480 and positioned so that the wafer 465 is below the positive electrode 450 after the arms 402 have extended the wafer 465 into station 480. An RF power generator 410 communicates with an impedance matching network 415 which regulates the current supplied to coil 445. Thus, as described previously, the frequency at which a plasma is generated between electrodes 450 and 460 is controllable. A gas supply 405 supplies a reactive gas to the reaction chamber 480. For example, the reactive gas seeps through apertures in the positive electrode 450, and is charged to create a plasma between electrodes 450 and 460. An ion source 425 is shielded behind electrode 450 and directs a beam of ions to the wafer 465 through an aperture in the electrode 450. Likewise, a detector 430 is shielded by the electrode 450 an detects reflected ions and scattered secondary ions from the wafer 465 through an aperture in the electrode 450. For example, the ion source 425 and the detector 430 may be components of a single apparatus 420, e.g., a voltage scanning electron microscope. The detector 430 communicates with a filter 435 which filters out signal portions attributed to detection of ions at the plasma frequency. The signal filter 435 communicates with a signal processor 440 which determines a value of the reflected ions and scattered ions based upon the signal. During the sputter etch to remove the oxide layer from the metal layer on wafer 465, the signal processor 440 monitors the value corresponding to the detected amount of reflected ions and scattered ions. When the value corresponding to the detected amount of reflected ions and scattered ions changes, signal processor 440 indicates that the etching process is complete and that the oxide layer has been removed from the metal. The wafer 465 is ready to be retracted by arms 402, pivoted by pivot mount 401 and extended by arms 402 into another station, for example, station 482 for depositing a metal layer.

The present invention provides new tools for detecting etch endpoints. Embodiments of the present invention expand the range of accurate etch endpoint determinations for various etching processes by detecting a beam after the beam impacts a wafer. Independence from detecting changes to etchants or to by-products of an etching process permits the present invention to accurately detect etch endpoints in numerous situations where current etch endpoint determination methods fail. For example, the present invention is capable of determining an etch endpoint when a small surface area of a wafer is etched because the present invention does not rely upon detecting the minor changes to etch by-products that result when a small surface area of a wafer is etched. As another example, by emitting and detecting a beam that impacts a wafer, the present invention can be placed and utilized in a large volume reaction chamber where current etch endpoint determining systems do not work.

While this invention has been described in connection with what is presently considered to be the most practical and preferred embodiment, it is to be understood that the invention is not limited to the enclosed embodiments, but, on the contrary, is intended to cover various modifications and equivalent arrangements included within the scope of the appended claims.

What is claimed is:

1. An apparatus for detecting an endpoint of an etch process comprising:

a reaction chamber;

a plasma source;

an ion source positioned to emit ions into the reaction chamber;

an ion detector positioned to detect ions in the reaction chamber, the ion detector detecting ions emitted from the ion source and reflected off a wafer located in the reaction chamber, and generates a signal based upon detected ions; and a signal processor coupled to the detector that determines a value based upon the signal from the ion detector.

2. The apparatus according to claim 1, further comprising:

a reactive gas source coupled to the reaction chamber;

a positive electrode in the reaction chamber, the positive electrode having a first aperture; and a negative electrode in the reaction chamber; wherein
a plasma is contained on one side of the positive electrode; and
the ion source is positioned to be shielded from the plasma by the positive electrode and emit ions through the first aperture in the positive electrode towards the wafer in the reaction chamber.

3. The apparatus according to claim 2, wherein:
the positive electrode has a second aperture, the ion detector being shielded by the positive electrode and detecting ions emitted by the ion source reflected off the surface of the wafer through the second aperture in the positive electrode.

4. The apparatus according to claim 3, further comprising:
a material covering the first and second apertures in the positive electrode that allows ions from the ion source to pass through the material and substantially blocks the plasma from passing through the material.

5. The apparatus according to claim 3, wherein the plasma source generates a plasma having a first frequency and the ion source modulates emitted ions at a second frequency:
the apparatus further comprising a frequency filter coupled between the detector and the signal processor, the frequency filter configured to remove signals generated by ions at the first frequency and transmit the filtered signal to the signal processor.

6. The apparatus according to claim 2, further comprising:
a shield to protect the ion source and the detector from the plasma, the shield having apertures for the ion source to emit ions through and the detector to detect ions through.

7. The apparatus according to claim 6, further comprising:
covers over the apertures in the shield that allow ions from the ion source to pass through the apertures and prevent the plasma from passing through the apertures.

8. The apparatus according to claim 1, wherein:
the ion source comprises a voltage contrast scanning electron microscope.

9. The apparatus according to claim 8, wherein:
the ion detector is part of the voltage contrast scanning electron microscope.

10. A method for detecting an endpoint of an etch process, comprising the steps of:
generating a plasma;
emitting ions from a source towards a wafer within a reaction chamber;
detecting ions within the reaction chamber after the ions from the source have impacted the wafer;
creating a signal based upon the detected ions;
determining a value for the detected ions based upon the signal;
etching the wafer;
monitoring the value while the wafer is etched; and
indicating the etch endpoint when the value changes to a second value.

11. The method according to claim 10, wherein:
the etch process is a plasma etch utilizing the plasma at a first frequency;
the source emits the ions at a second frequency; and
determining the value of the detected ions further comprises filtering the signal to remove signal portions generated by ions at the first frequency.

12. The method according to claim 10, wherein:
the wafer comprises a metal layer with an oxide layer on the metal layer;
etching comprises a sputter etch utilizing the plasma at a first frequency to remove the oxide layer from the metal;
the ions emitted from the source are at a second frequency; and
determining the value of the detected ions further comprises filtering the signal to remove signal portions generated by ions at the first frequency.

13. The method according to claim 10, wherein:
ions are emitted by a voltage contrast scanning electron microscope; and
ions are detected by the voltage contrast scanning electron microscope.

14. The method according to claim 10, further comprising the steps of:
pausing the etching process before monitoring the value while the wafer is etched;
comparing the monitored value to the determined value; and
resuming the etching process if the monitored value is substantially similar to the determined value; wherein indicating the etch endpoint occurs when the monitored value changes to a second value that is substantially different from the determined value.

15. The method according to claim 10, wherein:
emitting ions from a source towards a wafer comprises continuously emitting ions from the source towards the wafer.

16. A metal deposition system, comprising:
a vacuum chamber;
an etch station within the vacuum chamber;
a plasma source at the etch station;
an ion source at the etch station;
an ion detector at the etch station, the ion detector detects ions emitted from the ion source and reflected off a wafer located at the etch station, and generates a signal based upon detected ions and;
a signal processor coupled to the detector that determines a value based upon the signal from the detector.

17. The metal deposition system according to claim 16, wherein:
the plasma source generates a plasma having a first frequency;
the ion source generates ions at a second frequency; and further comprising
a filter coupled to the signal processor, the filter configured to remove signal portions generated by ions at the first frequency.

18. The metal deposition system according to claim 16, wherein:
the ion source comprises a voltage contrast scanning electron microscope; and
the detector is part of the voltage contrast scanning electron microscope.

19. The apparatus according to claim 16, further comprising:
a shield to protect the ion source and the detector from the plasma, the shield having apertures for the ion source to emit ions through and the detector to detect ions through.

20. The apparatus according to claim 19, further comprising:
covers over the apertures in the shield that allow ions from the ion source to pass through the apertures and prevent the plasma from passing through the apertures.

* * * * *